United States Patent [19]
Endo et al.

[11] Patent Number: 6,155,874
[45] Date of Patent: Dec. 5, 2000

[54] CONNECTING STRUCTURE FOR ELECTRONIC PART AND CONNECTION METHOD THEREOF

[75] Inventors: Takayoshi Endo, Haibara-gun; Yoshitaka Miura; Hidenori Sakai, both of Yokohama, all of Japan

[73] Assignee: Yazaki Corporation, Tokyo, Japan

[21] Appl. No.: 09/098,465

[22] Filed: Jun. 17, 1998

[30] Foreign Application Priority Data

Jun. 18, 1997 [JP] Japan ................................... 9-161446

[51] Int. Cl.$^7$ ................................................. H01R 13/73
[52] U.S. Cl. ........................... 439/547; 439/546; 439/57
[58] Field of Search ............................ 439/57, 546, 547, 439/329, 81

[56] References Cited

U.S. PATENT DOCUMENTS

| | | | |
|---|---|---|---|
| 2,953,769 | 9/1960 | Woofter et al. | 439/57 |
| 3,344,388 | 9/1967 | Parker et al. | 439/57 |
| 3,511,982 | 5/1970 | Salter | 439/57 |
| 3,604,919 | 9/1971 | MacPherson | 439/57 |
| 3,909,096 | 9/1975 | Brzozowski | 439/547 |
| 3,955,124 | 5/1976 | Jones | 439/547 |
| 4,005,924 | 2/1977 | Nestor | 439/57 |
| 4,029,953 | 6/1977 | Natoli | 439/546 |
| 4,468,585 | 8/1984 | Beyland et al. | 439/57 |
| 5,702,254 | 12/1997 | Whitson et al. | 439/57 |
| 5,890,912 | 4/1999 | Jenkins | 439/547 |

FOREIGN PATENT DOCUMENTS

| | | |
|---|---|---|
| 61-74218 | 5/1986 | Japan . |
| 2-41613 | 3/1990 | Japan . |
| 5-30037 | 5/1993 | Japan . |
| 5-50928 | 7/1993 | Japan . |

*Primary Examiner*—Paula Bradley
*Assistant Examiner*—Katrina Davis
*Attorney, Agent, or Firm*—Finnegan, Henderson, Farabow, Garrett & Dunner, L.L.P.

[57] ABSTRACT

Terminals of a solenoid valve which come into contact with an electrode portion of a circuit body are formed in a curved shape so as to generate a biasing force. A lock member to be inserted into a mounting hole of the circuit body projects from a bottom face of the solenoid valve. By turning the solenoid valve with the lock member being inserted into the mounting hole, the lock member engages with the mounting hole by receiving the biasing force. Thus, the solenoid valve can be mounted easily. The terminals are in elastic contact with the electrode portion thereby a reliability of connection being enhanced.

10 Claims, 6 Drawing Sheets

CONNECTING STRUCTURE FOR ELECTRONIC PART AND CONNECTION METHOD THEREOF

BACKGROUND OF THE INVENTION

This invention relates to a connection structure for connecting, for example, a solenoid valve for hydraulic pressure control provided in a case of an automatic transmission of vehicles to a circuit body and a connection method thereof.

In automatic transmission of vehicles, a plurality of solenoid valves for hydraulic pressure control are distributed and disposed within an oil pan below a transmission case. A wire like wire harness is connected to each solenoid valve terminal so as to supply electric power.

In a conventional connection structure, a plurality of solenoid valves are mounted on an automatic transmission base. Each solenoid valve has a terminal. A conductor of the wire is connected to each terminal by soldering. Wires are bundled and connected to wire harness of vehicle body.

However, the above connection structure requires placing of wires to be connected to the solenoid valves and soldering between the conductor and terminal. For the reason, there are many steps for connection so that the procedure is complicated and takes a long time.

On the contrary, a connection structure enabling a snap connection not requiring soldering has been known. In this structure, a bus bar for forming a branch circuit is disposed in a gap formed between a base plate and a cover. A hole shaped female terminal is formed at a predetermined position of the bus bar. A pin terminal of the solenoid valve engages with the female terminal so that the bus bar is connected with the solenoid valve.

In the aforementioned structure, the snap connection is enabled so that working efficiency for connection is excellent. However, if a solenoid valve mounting accuracy is low, the contact between the female terminal and the pin terminal of the solenoid valve becomes unstable. This connection structure has a lower reliability as compared to the soldering method.

This is the same for other electronic parts than the solenoid valve. Therefore, such a structure in which connecting procedure is simple and a high reliability is ensured has been demanded.

SUMMARY OF THE INVENTION

Accordingly, an object of the present invention is to provide a connection structure for electronic part enabling a connection with simple procedure and ensuring a high reliability and a connection method thereof.

To achieve the above object, according to a first aspect of the present invention, there is provided a connection structure for an electronic part, comprising:

a circuit body;

an electronic part;

a lock member projecting from the electronic part, the lock member having a lock protrusion;

a mounting hole provided to the circuit body, the lock member capable of being inserted into the mounting hole, the lock member inserted into the mounting hole turnable from a first position to a second position, the mounting hole having an engaging portion;

an electrode portion provided to the circuit body; and a terminal having spring characteristic provided to the electronic part, the terminal being elastically deformed such that the terminal is in contact with the electrode portion and develops a biasing force when the lock member is turned up to the second position, the lock protrusion and engaging portion being engaged with each other by the biasing force thereby preventing the lock member from slipping out of the mounting hole and from being turned to the first position.

According to a second aspect of the present invention, there is provided a connection structure for electronic part according to the first aspect, wherein the biasing force of the terminal acts in a counter insertion direction of removing the lock member from the mounting hole, when the biasing force is applied, the lock member moves in the counter insertion direction from the second position so that the lock protrusion engages with the engaging portion, and an engagement between the lock protrusion and engaging portion is released by pressing the lock member in an insertion direction.

According to a third aspect of the present invention, there is provided a connection structure for electronic part according to the first aspect, wherein the terminal is formed in a substantially U shape having an end to be fixed to the electronic part and the other end to be in contact with the electrode portion.

According to the first to the third aspects of the invention, by turning the electronic part with the lock member being inserted in the mounting hole, the lock member engages with the engaging portion so that the electronic part is mounted on the circuit body. In this mounting condition, the terminal of the electronic part comes into contact with the electrode portion of the circuit body so as to attain a conductive contact therebetween. Therefore, wire placing and soldering become unnecessary so that a simple connection is achieved.

The terminal has spring characteristic. Thus, when the electronic part is mounted on the circuit body, it is elastically deformed so as to generate a biasing force. The biasing force acts to keep the engagement condition between the lock protrusion and engaging portion. For the reason, the electronic part never slips unexpectedly, so that a stable connecting condition is secured. Further, because the terminal is in elastic contact with the electrode portion, the terminal keeps a firm contact with the electrode portion thereby a reliability of connection being enhanced.

According to a fourth aspect of the present invention, there is provided a connection structure for electronic part according to the first aspect, wherein the terminal has a small protrusion coming into contact with the electrode portion.

According to the fourth aspect of the invention, the small protrusion formed on the terminal comes into contact with the electrode portion. Therefore, a contacting area is small and a resistance generated when the electronic part is turned is small. Thus, the electronic part can be turned easily. Further, the small protrusion likely bites into the surface of the electrode portion, so that oxide layer on the surface of the electrode portion is excellently removed with a turn of the electronic part.

According to a fifth aspect of the present invention, there is provided a connection structure for electronic part according to the first aspect, wherein the electrode portion is formed in a circular shape along a turning trace of the electronic part, and the terminal keeps a sliding contact with the electrode portion when the lock member moves from the first position to the second position.

According to the fifth and sixth aspects of the invention, because the electrode portion is formed in the circular shape, the terminal is always in contact with the electrode portion during a turn of the electronic part. Therefore, the terminal never leaves the electrode portion so as to ensure a stable contact.

Further, because the terminal slides on the electrode portion during a turn of the electronic part, the oxide layer on the surface of the electrode portion is removed. Thus, the terminal comes into contact with a new surface not yet oxidized of the electrode portion, so that an excellent conductive contact is secured between the terminal and electrode portion, thereby achieving a reliable connecting state.

According to a seventh aspect of the present invention, there is provided a connection structure for electronic part according to the fifth aspect, wherein the engaging portion is provided within the mounting hole, the lock member engages with the engaging portion inside the circuit body, and the terminal is pressed against the electrode portion when the electronic part is inserted into the mounting hole.

According to the seventh aspect of the invention, when the lock member of the electronic part is inserted into the mounting hole, the lock protrusion engages with the engaging portion inside the circuit body so that the terminal is pressed against the electrode portion. That is, the terminal is securely connected to the electrode portion by mounting the electronic part on the circuit body.

According to an eighth aspect of the present invention, there is provided a connection method for electronic part, comprising the steps of:

inserting a lock member projecting from an electronic part into a mounting hole provided to a circuit body against a biasing force from terminal on the electronic part, the terminal having spring characteristic being elastically deformed such that the terminal is in contact with an electrode portion of the circuit body when the lock member is inserted into the mounting hole and located at a first position;

turning the lock member from the first position to the second position, the terminal keeping a sliding contact with the electrode portion during a turn of the lock member, the lock protrusion of the electronic part engaging with the engaging portion of the lock member by the biasing force when the lock member reaches the second position, an engagement between the lock protrusion and the engaging portion preventing the lock member from slipping out of the mounting hole and from being turned to the first position; and turning the lock member toward the first position.

According to the eighth aspect of the invention, the lock member is engaged with the engaging portion by turning the electronic part with the lock member being inserted in the mounting hole. Thus, the electronic part can be mounted on the circuit body by a simple operation. Further, because the terminal slides on the electrode portion during a turn of the electronic part, oxide layer on the surface of the electrode portion is scratched. Further, by turning back the electronic part after the lock protrusion engages with the engaging portion, the terminal comes into contact with not scratched dust of oxide layer but a new surface of the electrode portion. Thus, an excellent conductive contact with the electrode portion is secured thereby a reliability of connection being enhanced.

DESCRIPTION OF THE PREFERRED EMBODIMENTS

Figure 1:
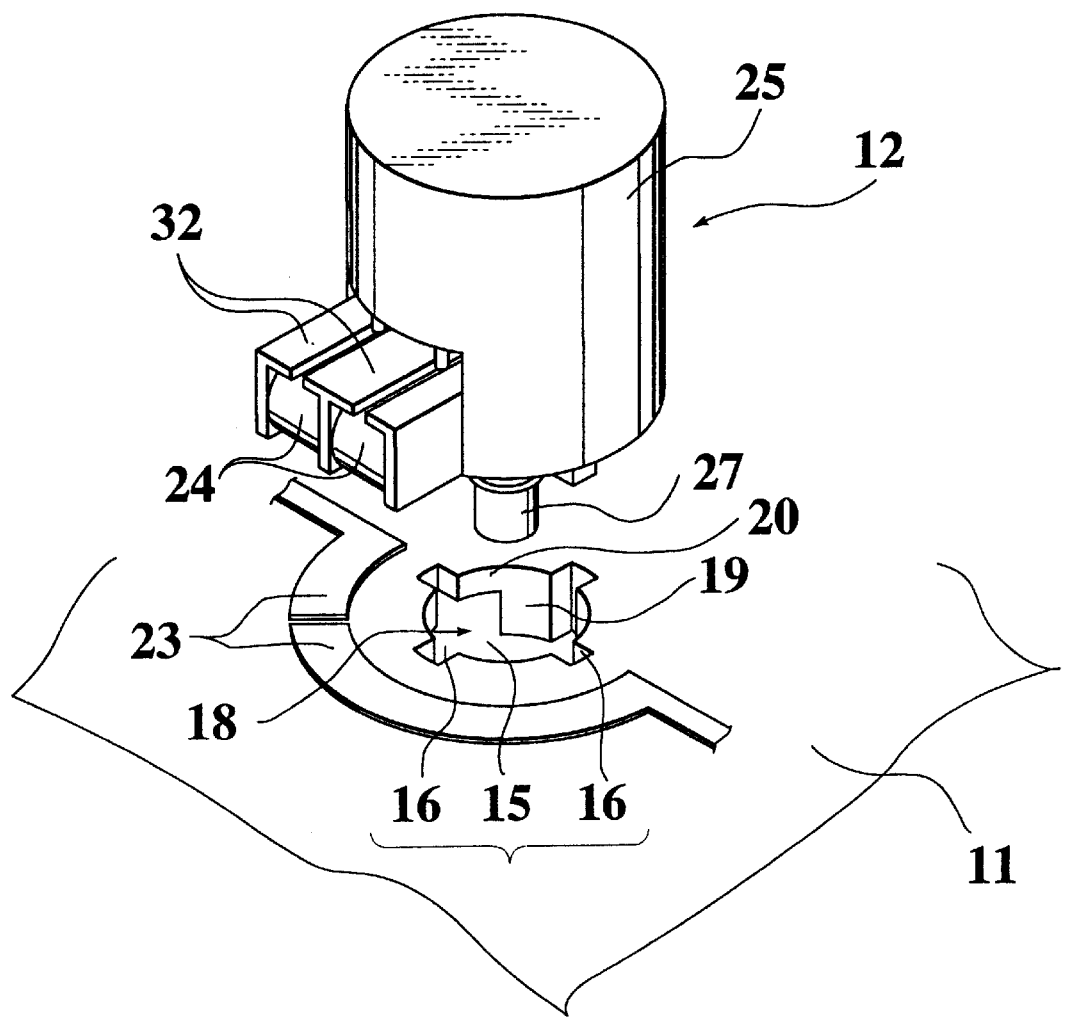
FIG. 1 is a perspective view of an embodiment of the present invention.
Figure 2:
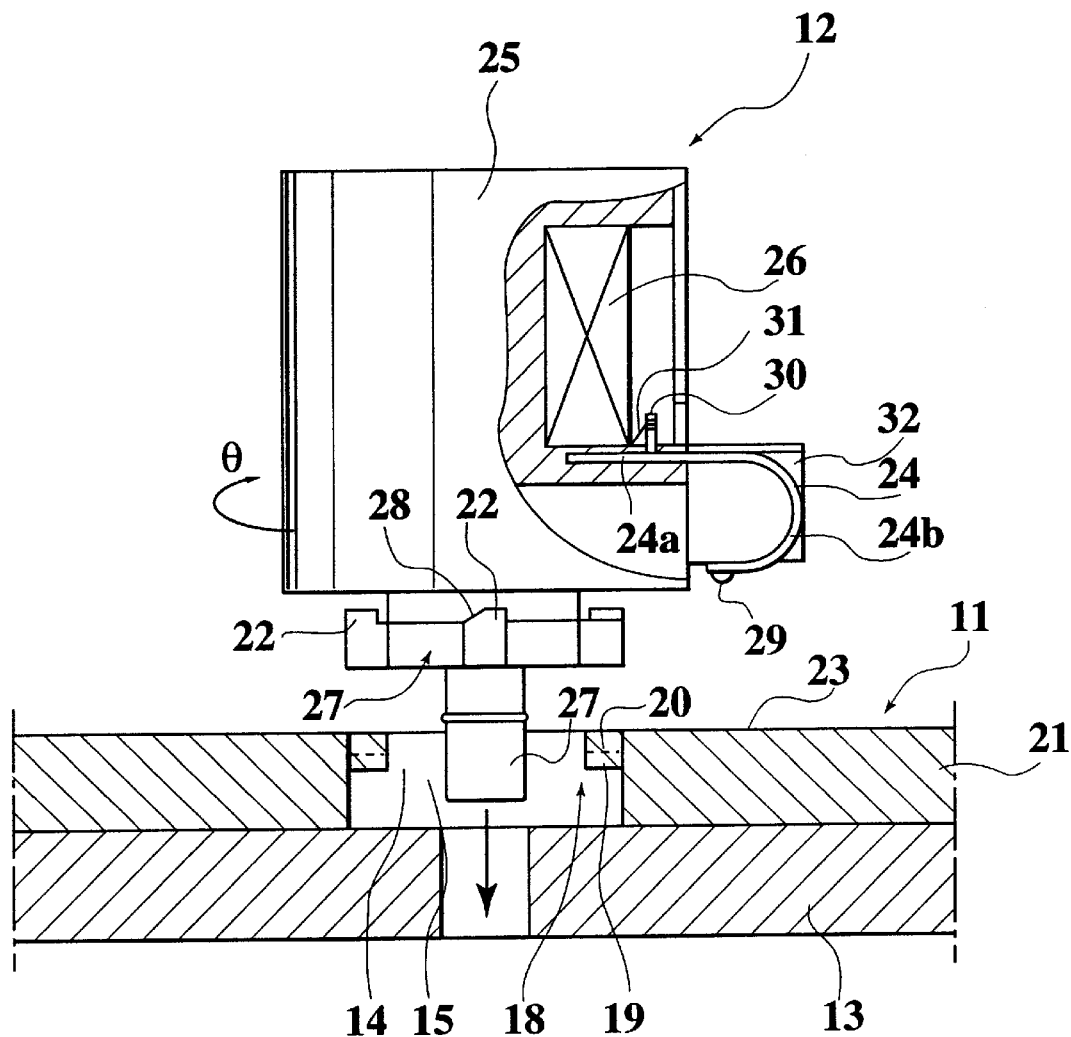
FIG. 2 is a sectional view of a solenoid valve before connection.
Figure 3:
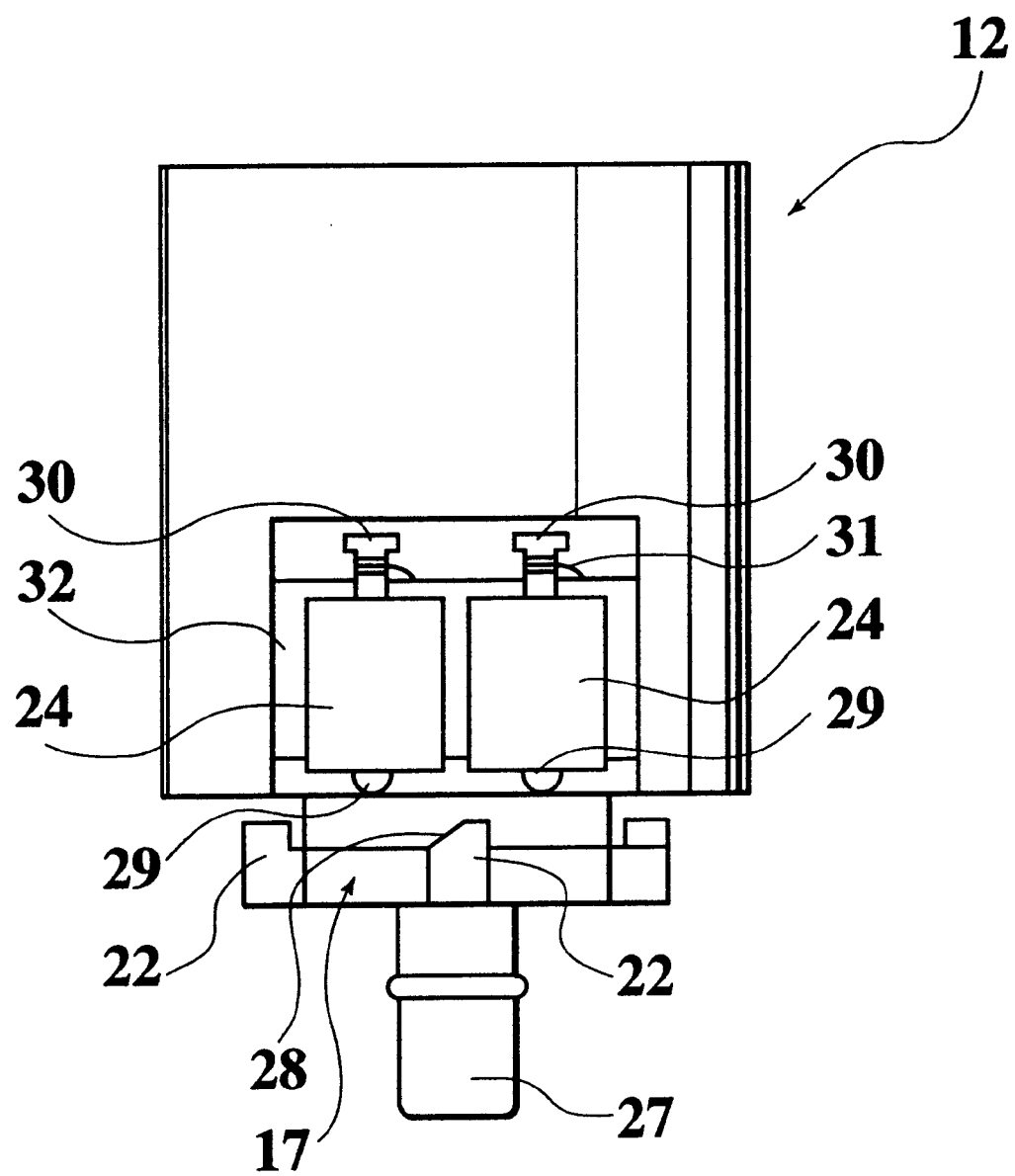
FIG. 3 is a front view of the solenoid valve.

Hereinafter, the embodiment of the present invention will be described with reference to the accompanying drawings. FIGS. 1 to 7 show an embodiment of the present invention which is applied to a vehicle automatic transmission. FIG. 1 is a perspective view of the entire structure and FIG. 2 is a sectional view before a solenoid valve is connected. A vertical direction mentioned in this specification refers to a vertical direction relative to FIG. 2.

A circuit body 11 contains a main body 21 which is formed in the shape of an insulating plate. This main body is disposed on a base 13 (see FIGS. 2, 5, 7) of an automatic transmission. A mounting hole 14 is formed as a through hole at a place of the circuit body 11, on which a solenoid valve (electronic part) 12 is to be mounted.

Figure 5:
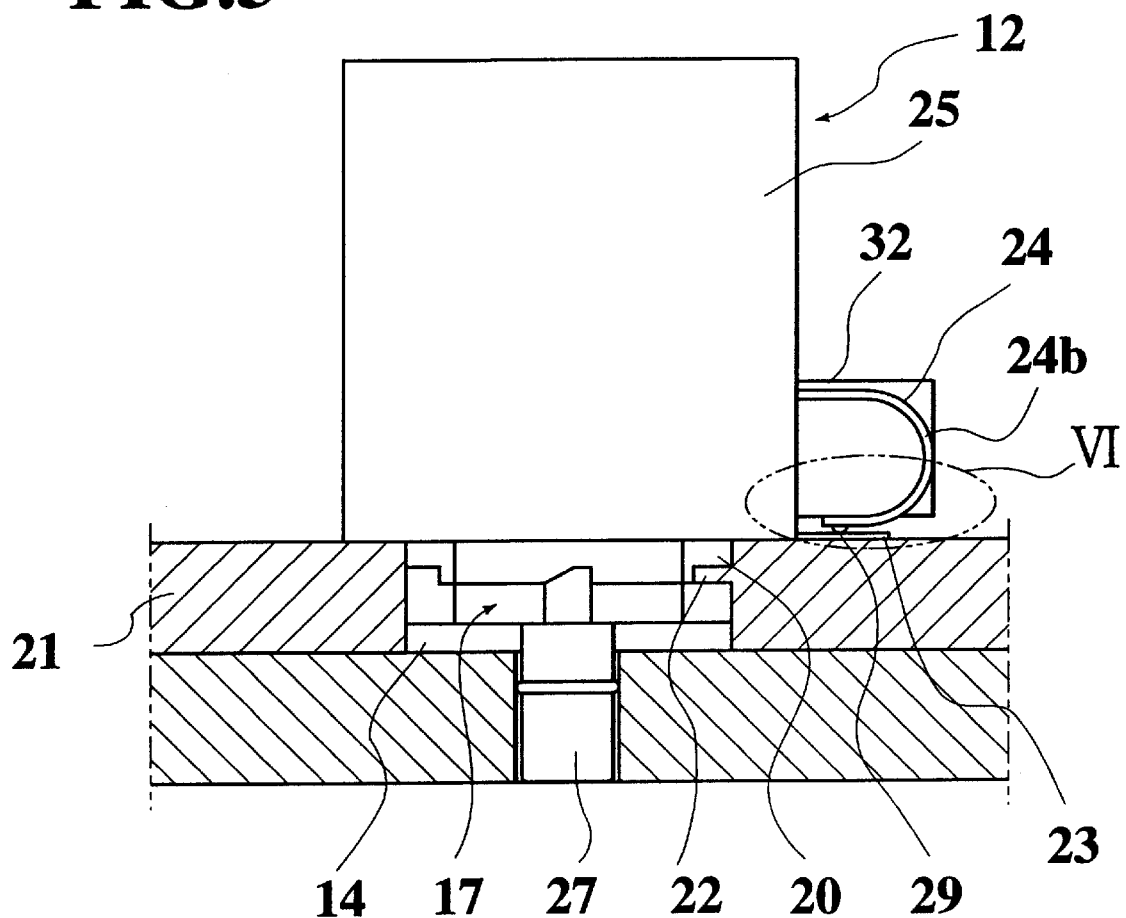
FIG. 5 is a sectional view of a state in which the solenoid valve is connected.

The mounting hole 14 includes a central circular hole portion 15 and square hole shaped slit portions 16 which are disposed at every 90° and communicate with a periphery of the hole portion 15. As described later, a lock member 17 of the solenoid valve 12 is passed through the slit portions 16 so that the lock member 17 is inserted into the mounting hole 14 as shown in FIG. 5.

A wall portion 18 for forming the mounting hole 14 includes a stopper portion 19 and an engaging portion 20 having a smaller thickness than the stopper portion 19 as shown in FIGS. 1, 2. The wall portion is provided each between the slit portions 16. If a lock protrusion 22 of a lock member 17 comes into contact with the stopper portion 19, a rotation of the lock member 17 is prevented. The lock protrusion 22 of the lock member 17 is engaged with a bottom face of the engaging portion 20 so that the lock member 17 is prevented from slipping out of the mounting hole 14.

Figure 4:
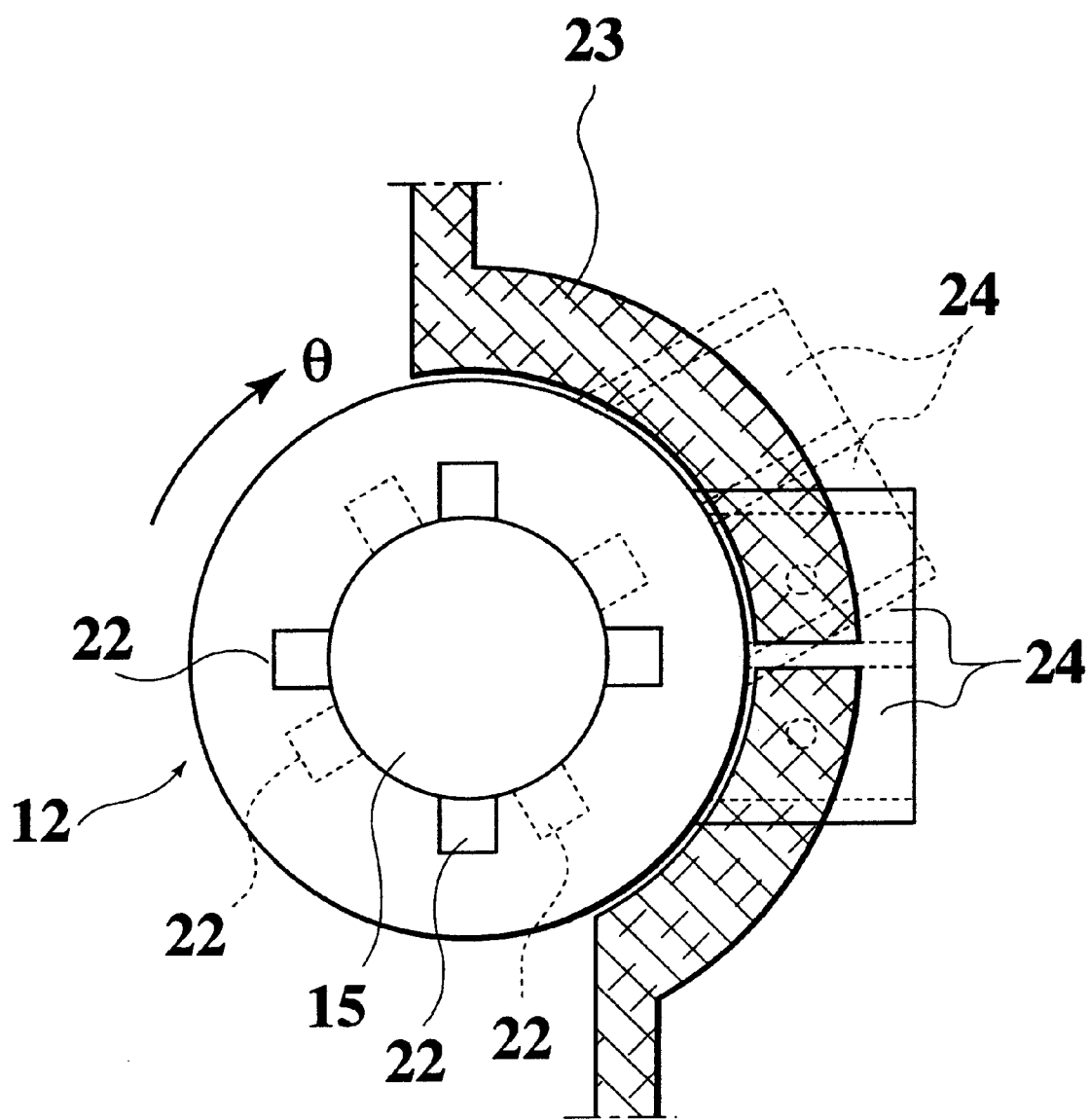
FIG. 4 is a plan view of an operation for connecting the solenoid valve.

An electrode portion 23 is formed on the surface of the main body 21 of the circuit body 11. The electrode portion 23 is disposed around the mounting hole 14. The electrode portion 23 is in a conductive contact with terminals 24 of the solenoid valve 12. The electrode portion 23 according to this embodiment is formed in a circular shape along a turning trace of the solenoid valve 12 as shown in FIGS. 1, 4. Because the electrode portion 23 is formed in the circular shape, the terminals 24 of the solenoid valve 12 never slips out of the electrode portion 23 during and after a turning of the solenoid valve 12. Thus, a firm contact is secured between the terminals 24 and electrode portion 23. The electrode portion 23 may be a printed circuit, a bus bar or of other structure.

The solenoid valve 12 comprises a cylindrical main body 25, the lock member 17 projecting from a bottom face of the main body 25 and terminals 24 provided on a side of the main body 25.

The main body 25 is formed of insulating resin. A coil 26 is provided within the main body 25 as shown in FIG. 2. A base 27 is projected from the bottom face of the main body 25. The base 27 passes through the lock member 17 and extends further downward.

The lock member 17 projected from the bottom face of the main body 25 is formed in a circular ring shape. An outside diameter of the lock member 17 is set so that the lock member 17 can be inserted into the hole portion 15 of the mounting hole 14 of the circuit body 11. The lock protrusion 22 is turned integrally with the solenoid valve 12 in the mounting hole 14 when the solenoid valve 12 is turned with the lock protrusion being inserted in the hole portion 15. Four lock protrusions 22 are formed on the periphery of the lock member 17.

The lock protrusions 22 are formed at every 90° on the periphery of the lock member 17. The lock protrusion 22 is inserted into each corresponding slit portion 16 of the mounting hole 14. The lock protrusions 22 extend upward over the lock member 17. An upper end of the lock protrusion 22 is engageable with the engaging portion 20 of the mounting hole 14 as shown in FIG. 5. A tapered portion 28 is formed in cutout shape in a turning direction θ of the solenoid valve 12 on the upper end of each lock protrusion 22. By an operation of the tapered portion 28, the lock protrusion 22 is engaged with the engaging portion 20 smoothly with a turning of the solenoid valve 12.

The terminals 24 supply power to the coil 26 in the main body 25. The solenoid valve 12 according to this embodiment is actuated by two poles and therefore the terminals 24 are formed of two poles. The two-pole terminals 24 are disposed adjacent to each other as shown in FIGS. 1, 4.

As shown in FIG. 2, each terminal 24 includes a fixing portion 24a at the proximal end and a contacting portion 24b at the distal end. The fixing portion 24a is fixed to the main body 25 such that it is buried in the main body 25. The contacting portion 24b is projected sideways out of the main body 25. The terminals 24 are projected from only one side of the main body 25. Thus, the lateral length of the solenoid valve 12 can be reduced, so that the mounting space can be minimized.

The contacting portion 24b of the terminal 24 is curved downward (toward the circuit body 11) in a substantially U shape. This curved front end portion faces the electrode portion 23 of the circuit body 11. Because of this curved portion, the terminal 24 has spring characteristic so as to generate a biasing force. By the biasing force of the terminal 24, the contacting portion 24b comes into contact with the electrode portion 23 at a high contacting pressure. Because the terminals 24 are in a firm contact with the electrode portion 23 by such a contacting structure, the reliability of connection is enhanced. Further, the biasing force of the terminal 24 acts so as to engage the lock protrusion 22 with the engaging portion 20. Thus, the lock protrusion 22 never slips out of the engaging portion 20 so as to prevent the solenoid valve 12 from slipping unexpectedly.

The contacting portion 24b of the terminal 24 has a small protrusion 29 on its side facing the circuit body 11. The small protrusion 29 is formed in a shape of bead, indent or the like and the small protrusion 29 contacts the electrode portion 23 of the circuit body 11.

Each terminal 24 has a connecting pin 30 for supplying power to the coil 26 as shown in FIG. 2. A wire 31 is connected to the connecting pin 30 from the coil 26.

The respective terminals 24 are accommodated in a hood 32 projecting from a side of the main body 25. This prevents the terminals 24 from being in contact with each other.

Next, a connecting procedure according to this embodiment will be described.

As shown in FIGS. 1, 2, the solenoid valve 12 is moved so as to confront the lock member 17 with the mounting hole 14 of the circuit body 11 and the lock protrusion 22 is aligned with the slit portion 16. Then, the lock member 17 is entirely inserted into the mounting hole 14. By this insertion, the bottom face of the main body 25 of the solenoid valve 12 comes into contact with a top face of the circuit body 11 and the terminals 24 are bent so that the small protrusion 29 comes into contact with the electrode portion 23.

With this condition, the solenoid valve 12 is turned at a specific angle in the θ direction shown in FIGS. 2, 4. The lock member 17 is turned integrally with the solenoid valve 12. As a result, the lock protrusion 22 moves from a dotted line position of FIG. 4 to a solid line position so that it comes into contact with the stopper portion 19. Then, the rotation of the solenoid valve 12 is stopped and the lock protrusion 22 come into contact with the bottom face of the engaging portion 20. By this engagement, the solenoid valve 12 is engaged with the circuit body 11.

When the solenoid valve 12 is turned, the terminal 24 in which the small protrusion 29 is in contact with the electrode portion 23 moves from the dotted line position to the solid line position of FIG. 4. In a condition in which the small protrusion 29 is in contact with the electrode portion 23, a contacting area with the electrode portion 23 is small. Thus, a rotational resistance is small so that the solenoid valve 12 can be turned easily.

During a traveling of the terminal 24, the small protrusion 29 moves on the electrode portion 23 such that it is in contact with the electrode portion 23 by a biasing force of the terminal 24. By this sliding, the small protrusion 29 scratches oxide layer on the surface of the electrode portion 23. Thus, the small protrusion 29 gets into contact with a new surface not yet oxidized of the electrode portion 23. Thus conduction between the terminal and electrode portion is improved so that a highly reliable connecting state is attained.

Figure 6:
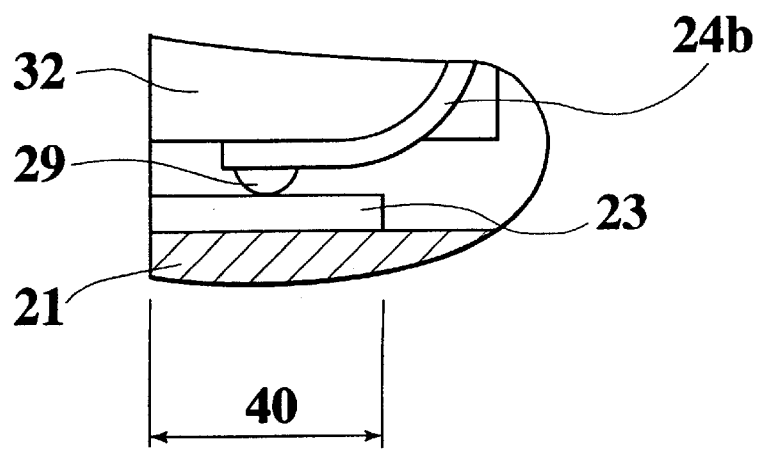
FIG. 6 is a sectional view of an enlarged XI portion.
Figure 7:
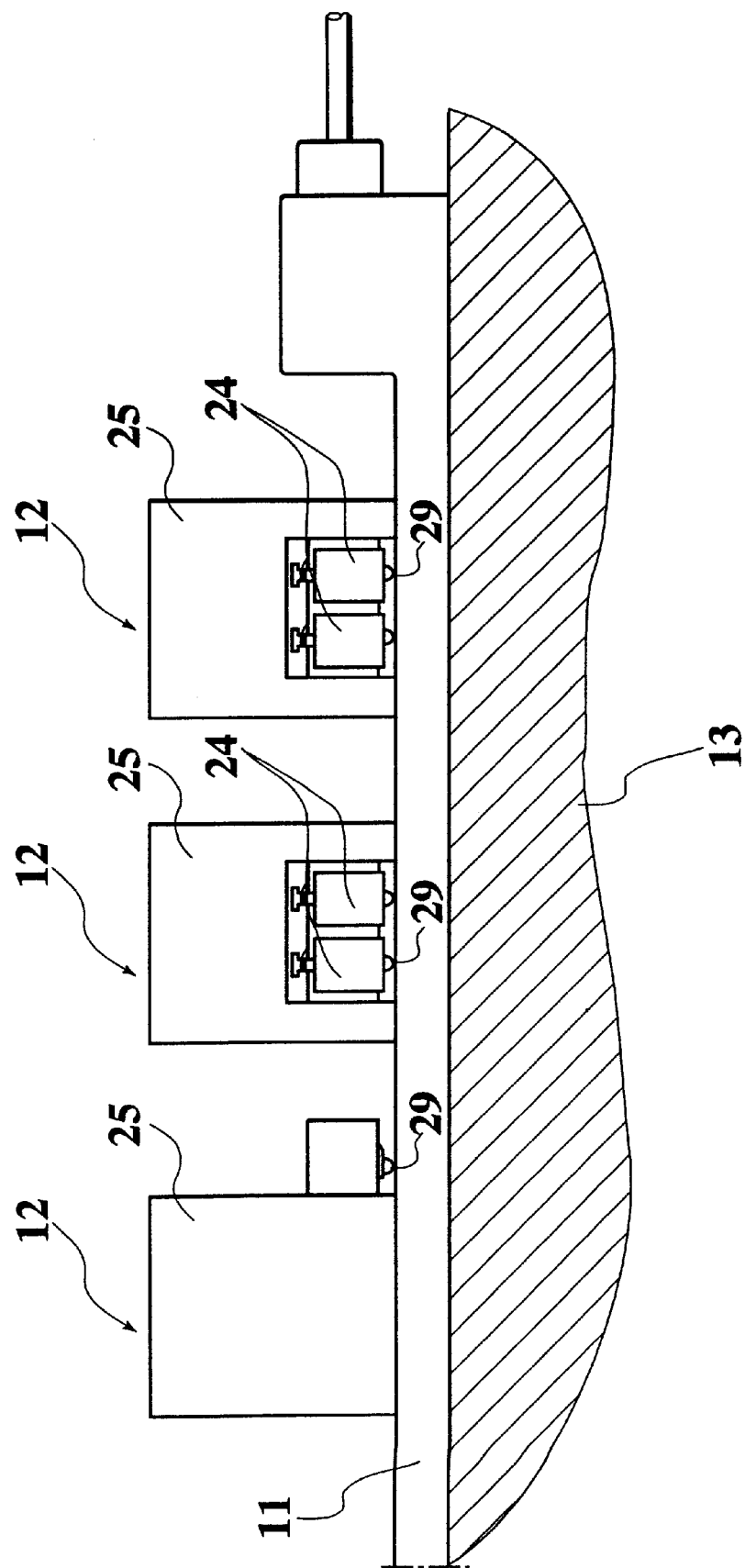
FIG. 7 is a side view showing a mounting state of the solenoid valves on the circuit body.

Further, the small protrusion 29 of the terminal 24 is in contact with the electrode portion 23 in a range indicated by reference numeral 40 of FIG. 6. Thus, the allowable deflection range is large so that a stable contacting state can be secured.

The lock protrusion 22 comes into contact with the stopper portion 19 so that the rotation of the solenoid valve 12 is stopped and then the lock protrusion 22 engaged with the engaging portion 20. After that, the solenoid valve 12 is turned at a slight angle in opposite direction. Because of this turning in opposite direction, the small protrusion 29 of the terminal 24 is not in contact with removed dust of oxide layer so that it is in contact with a new surface of the electrode portion. Thus, an excellent conductive contact is secured between the terminals 24 and the electrode portion 23.

According to the above-described embodiment, the solenoid valve 12 can be mounted and conductively connected with the electrode portion 23 only by rotating the solenoid valve 12 with the lock member 17 being inserted into the mounting hole 14. Therefore, wire placing, soldering and the like become unnecessary, so that a simple connection is achieved.

Further, the terminals 24 are elastically deformed in the mounting direction when the solenoid valve 12 is mounted on the circuit body 11 so that engagement between the lock protrusion 22 and engaging portion 20 is secured by the biasing force of the terminals 24. Therefore, there does not occur a case in which the solenoid valve 12 is turned due to vibration or the like so that it moves to its insertion position. Thus, the solenoid valve 12 never slips out unexpectedly thereby achieving a stable mounting condition.

Further, because the terminals 24 are in elastic contact with the electrode portion 23, the terminals and electrode portion are in firm contact with each other thereby reliability of contact being improved.

Further, according to the present invention, it is permissible to dispose a plurality of the terminals 24 such that they are apart at 90° or 180°. This invention can be also applied to a connection of electronic parts as well as the solenoid valve 12.

What is claimed is:

1. A connection structure for an electronic part, comprising:
   a circuit body;
   an electronic part;
   a lock member projecting from the electronic part, the lock member having a lock protrusion;
   a mounting hole provided to the circuit body, the lock member capable of being inserted into the mounting hole, the lock member inserted into the mounting hole being turnable from a first position to a second position, the mounting hole having an engaging portion and a stopper portion, the mounting hole having a greater length along said stopper portion than along said engaging portion, said lock protrusion engaging said stopper portion to prevent rotation of the lock member beyond the second position when the lock member is turned to the second position;
   an electrode portion provided to the circuit body; and
   a terminal having spring characteristic provided to the electronic part, the terminal being elastically deformed such that the terminal is in contact with the electrode portion and develops a biasing force when the lock member is turned up to the second position, the terminal rotating with the electronic part when the lock member is turned from the first position to the second position, the lock protrusion and engaging portion being engaged with each other by the biasing force thereby preventing the lock member from slipping out of the mounting hole and from being turned to the first position.

2. A connection structure for electronic part according to claim 1, wherein
   the biasing force of the terminal acts in a counter insertion direction of removing the lock member from the mounting hole,
   the lock member moves in the counter insertion direction from the second position so that the lock protrusion engages with the engaging portion, when the biasing force is applied, and
   an engagement between the lock protrusion and engaging portion is released by pressing the lock member in an insertion direction.

3. A connection structure for electronic part according to claim 1, wherein
   the terminal is formed in a substantially U shape having an end to be fixed to the electronic part and the other end to be in contact with the electrode portion.

4. A connection structure for electronic part according to claim 1, wherein
   the terminal has a small protrusion coming into contact with the electrode portion.

5. A connection structure for electronic part according to claim 1, wherein
   the electrode portion is formed in a circular shape along a turning trace of the electronic part, and
   the terminal keeps a sliding contact with the electrode portion when the lock member moves from the first position to the second position.

6. A connection structure for electronic part according to claim 5, wherein
   the electrode portion is disposed around the mounting hole.

7. A connection structure for electronic part according to claim 5, wherein
   the engaging portion is provided within the mounting hole,
   the lock member engages with the engaging portion inside the circuit body, and
   the terminal is pressed against the electrode portion when the electronic part is inserted into the mounting hole.

8. A connection method for an electronic part, comprising the steps of:
   inserting a lock member projecting from an electronic part into a mounting hole provided to a circuit body against a biasing force from a terminal on the electronic part, the terminal having spring characteristic being elastically deformed such that they are in contact with an electrode portion of the circuit body when the lock member is inserted into the mounting hole and located at a first position;
   turning the lock member from the first position to the second position, the terminal keeping a sliding contact with the electrode portion during a turn of the lock member, the terminal rotating with the electronic part when the lock member is turned from the first position to the second position, the lock protrusion of the electronic part engaging with an engaging portion of the mounting hole by the biasing force when the lock member reaches the second position, an engagement between the lock protrusion and the engaging portion preventing the lock member from slipping out of the mounting hole and the lock member from being turned to the first position, the lock protrusion of the electronic part engaging with a stopper portion of the mounting hole to prevent rotation of the lock member beyond the second position when the lock member is turned to the second position, the stopper portion of the mounting hole having a greater length than the engaging portion of the mounting hole; and
   turning the lock member toward the first position.

9. A connection structure for an electronic part, comprising:
   a circuit body including a plate;
   an electronic part;
   a lock member projecting from the electronic part, the lock member having a lock protrusion;
   a mounting hole provided in said plate of the circuit body, the lock member capable of being inserted into the mounting hole, the lock member inserted into the mounting hole being turnable from a first position to a second position, the mounting hole having an engaging portion and a stopper portion, said lock protrusion engaging said stopper portion to prevent rotation of the lock member beyond the second position upon the lock member being turned to the second position;
   an electrode portion provided on said plate of the circuit body; and a terminal having spring characteristic provided to the electronic part, the terminal being deformed such that the terminal is in contact with the electrode portion and develops a biasing force when the lock member is turned up to the second position, the terminal rotating with the electronic part when the lock member is turned from the first position to the second position, the lock protrusion and engaging portion being engaged with each other by the biasing force thereby preventing the lock member from slipping out of the mounting hole and from being turned to the first position.

10. The connection structure for an electronic part according to claim 9, wherein said plate has a greater thickness at said stopper portion than at said engaging portion.

* * * * *

UNITED STATES PATENT AND TRADEMARK OFFICE
CERTIFICATE OF CORRECTION

PATENT NO. : 6,155,874  
DATED : December 5, 2000  
INVENTOR(S) : Takayoshi Endoi et al.

Page 1 of 1

It is certified that error appears in the above-identified patent and that said Letters Patent is hereby corrected as shown below:

Title page,
Item [54], Title, "CONNECTING" should read -- CONNECTION --.

Column 9, claim 9,
Line 2, after "being", insert -- elastically --.

Signed and Sealed this

Ninth Day of April, 2002

*Attest:*

JAMES E. ROGAN
*Director of the United States Patent and Trademark Office*

*Attesting Officer*